(12) United States Patent
Bourdin et al.

(10) Patent No.: US 6,807,509 B2
(45) Date of Patent: Oct. 19, 2004

(54) METHOD AND SYSTEMS TO MEASURE PROPAGATION DELAY IN SEMICONDUCTOR CHIPS

(75) Inventors: Laurence Bourdin, Vence (FR); Gilbert Cadopi, Vence (FR); Jean-Luc Frenoy, Cagnes sur Mer (FR); Jean-Michel Jullien, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 10/309,639

(22) Filed: Dec. 4, 2002

(65) Prior Publication Data

US 2003/0107393 A1 Jun. 12, 2003

(51) Int. Cl.[7] ................................. G06F 19/00
(52) U.S. Cl. .................. 702/125; 702/125; 702/57; 331/107 R; 455/255; 455/265; 327/182; 327/191
(58) Field of Search ................... 702/57, 66, 70, 702/71, 73, 75, 78–80, 89, 125; 331/57, 107 R; 455/255, 265; 327/182, 191

(56) References Cited

U.S. PATENT DOCUMENTS

| | | | | |
|---|---|---|---|---|
| 4,688,947 A | * | 8/1987 | Blaes et al. | 368/120 |
| 4,980,586 A | * | 12/1990 | Sullivan et al. | 327/262 |
| 5,471,176 A | * | 11/1995 | Henson et al. | 331/1 A |
| 6,574,579 B1 | * | 6/2003 | Watanabe | 702/124 |
| 6,621,767 B1 | * | 9/2003 | Kattan | 368/113 |

OTHER PUBLICATIONS

Bermond et al., 'Characterization and Simulation of Signal Propagation and Cross Talk on Advanced Cu–SiO2 On–Chip Interconnects for High Speed Circuits', May 2001, IEEE, pp. 104–106.*

Soumyanath et al., 'Accurate On–Chip Interconnect Evaluation: A Time–Domain Technique', May 1999, IEEE, pp. 623–631.*

* cited by examiner

Primary Examiner—Marc S. Hoff
Assistant Examiner—Elias Desta
(74) Attorney, Agent, or Firm—Lisa J. Ulrich

(57) ABSTRACT

A method and systems to evaluate the propagation delay within a semiconductor chip (305) that is embedded in an electronic system without requiring measurement apparatus and specific electrical contacts is disclosed. Since most of electronic systems use a microprocessor, the basic principle of the invention consists in using the microprocessor capabilities to measure the propagation delay of a chip embedded in such an electronic system. Thus, according to the invention, the microprocessor transmits an instruction to the semiconductor chip that performs propagation delay evaluation and then read the result in a dedicated memory register (415) of the chip. As a consequence, the chip does not require dedicated pins and measurement apparatus. In order to measure the propagation delay, the chip comprise a logic path (400) wherein propagation delay is created, then a rising edge detector (405) is used to analyze logic path signals, A counter (410) based on a system clock is used to measure propagation delay. The content of the counter is stored in a memory register (415) of the chip (305).

15 Claims, 6 Drawing Sheets

METHOD AND SYSTEMS TO MEASURE PROPAGATION DELAY IN SEMICONDUCTOR CHIPS

FIELD OF THE INVENTION

The present invention relates to semiconductor chip performance measure and more specifically to a method and systems to determine the propagation delay in a semiconductor chip when the semiconductor chip is embedded in an electronic system, without requiring external measure devices or specific electrical contacts.

BACKGROUND OF THE INVENTION

Improvements in semiconductor processes are making possible integrated circuits of increasing size and complexity. The semiconductor processing technologies that produce these integrated circuits have advanced to the point where complete systems can now be reduced to a single integrated circuit or Application Specific Integrated Circuit (ASIC) device. These integrated circuits, also referred to as die or chip, may use many functions that previously could not be implemented on a single die. It is a common practice for the manufacturers of such integrated circuits to thoroughly test device functionality at the manufacturing site.

In addition, interconnecting the millions of transistors that may be present on a chip also poses difficulties. To aid in this task, new multiple layer metallization schemes have been developed that allow up to five or more distinct levels or layers of metal interconnect wires. In such multiple layer metallization schemes, the various metal interconnect wires typically have different nominal widths and heights, different distances from transistor gates, and are insulated by oxide layers of varying thickness. These differences in the physical properties of the metal layers cause different metal layers to exhibit somewhat dissimilar electrical characteristics, resulting in disparities in propagation delays that a signal experiences when communicated over routing wires formed from the different metal layers. As a consequence, chip manufacturers perform measures so as to verify that propagation delays are comprised within pre-defined range values. Chips that don't fulfill these requirements must be rejected.

However, such propagation delays may impact behavior of a whole electronic system, e.g. Printed Circuit Board (PCB) in several cases. For example, a chip may be out of designer specifications, even if this chip has been tested by chip manufacturer, when problems occur during test. Likewise, a chip designer may underestimate timing delays that may impact the whole electronic system functionality. Thus, measuring the propagation delay within a chip is helpful to determine the origin of detected problems as well as optimizing chip manufacturer processes or tests.

There is thus a need to evaluate propagation delay of chips mounted on PCBs. To that end, standard solutions consist in designing dedicated logic paths in the chips with corresponding dedicated pins. These pins may be accessed with signal generator and measure apparatus so as to measure the signal propagation delay along this logic path. When the propagation delay is evaluated for the known logic path, the propagation delay of each element of the logic path may be estimated and thus, the propagation delay of each element of the chip may also be estimated.

FIGS. 1 and 2 illustrate standard logic paths and corresponding timing analysis.

FIG. 1a shows a part of a chip 100 comprising pins 105 and 110 connected to a receiver 115 and a driver 120 respectively. A ring oscillator comprising logic elements 125-1 to 125-n is implemented on chip 100. First element 125-1 consists in a NAND gate. One input of NAND gate 125-1 is connected to receiver 115 and the other input is connected to the ring oscillator output. In this example, logic elements 125-2 to 125-n consist in inverters. The number of logic elements depends upon the propagation delay that must be evaluated and the system clock frequency. The ring oscillator output frequency must be very small compared with the system clock frequency. It is to be noticed that it is required to use an odd number of inverters in the ring oscillator logic path so that ring oscillator oscillates and does not reach a stable state. FIG. 1b illustrates a timing analysis of logic path comprised between pins 105 and 110 of chip 100. After a transition state of the input signal, from 0 to 1 in this example, an initialization phase occurs in the ring oscillator until its output frequency reaches a constant value, i.e. a constant frequency that depends upon the number and nature of ring oscillator logic elements and the propagation delay of each of these elements. Thus, the propagation delay may be easily determined. An approximation value D of the transmission delay is determined according to the following equation:

$$D = \frac{NC}{f_{s\_clk}} \quad \text{(eq. 1)}$$

where NC is the number of system clock pulses counted during one period of the ring oscillator output signal and $f_{s\_clk}$ represents the frequency of the system clock, referred to as s_clk.

The approximation value D of the propagation delay may be improved by counting the number of system clock pulses during several periods, e.g. p, of the ring oscillator output signal. Thus, the improved approximation value D of the transmission delay is determined according to the following equation:

$$D = \frac{NC}{p \cdot f_{s\_clk}} \quad \text{(eq. 2)}$$

FIG. 2a represents an alternative of the logic path described on FIG. 1, that does not comprised loop. Chip 100' comprises pins 105' and 110' connected to a receiver 115' and a driver 120' respectively. A logic path consisting in logic elements 125'-1 to 125'-n, e.g. inverters, serially connected, links receiver 115' to driver 120'. FIG. 2b shows an example of the behavior of input and output signals referred to as input' and output' respectively. When signal input' state changes, e.g. from 0 to 1, signal output' states changes after signal input' has been transmitted from pin 105' to pin 110', the state transition depends upon the logic path elements 125'-1 to 125'-n. For example, if n is an even number and signal input' state changes from 0 to 1, signal output' state will also change from 0 to 1. The time difference between transition of signals input' and output' corresponds to the propagation delay, as shown.

FIG. 3 illustrates the method that is generally used to measure propagation delay of a chip comprising a dedicated logic path and corresponding I/O pins such that the ones described above by reference to FIGS. 1 and 2. A PCB 300 comprises two semiconductor chips 305-1 and 305-2, e.g. switch devices using high-speed clock, controlled with a local processor 310. The board may also comprise other semiconductor chips, e.g. companion chips 315-1 to 315-4 and DC controller 320-1 and 320-2. PCB 300 includes at least one connector 325 that comprises pins 330-i or corresponding holes so that PCB may transmit/receive data to/from a back plane or another electronic system (not represented) as well as power and control signals. In order to measure the propagation delay of a chip, one needs to connect dedicated pins to measure apparatus (signal generator and analyzer), e.g. apparatus 335 and 340, using adapted probes. Depending upon PCB environment conditions, the probes may be attached to the chip dedicated pins, e.g. probes 345-1 and 345-2 are connected to pins 350-1 and 350-2 respectively, to specific conductive area of the PCB, e.g. probes 345'-1 and 345'-2 are connected to dedicated conductive areas 355-1 and 355-2 respectively, or to back plane or electronic system connectors (not represented). If the probes are connected to the chip dedicated pins through specific conductive area of the PCB or to back plane or electronic system connectors, the PCB designers must design corresponding tracks. These two last methods are generally not used in complex electronic system, e.g. network switch system, since signal tracks are surface consuming and may lead to signal interferences.

As a consequence, these propagation delay measurement methods present major drawbacks that mainly lie in the measure apparatus and the accesses to the chip or board that are required. When a system is in used in a customer location these requirements may be such that it is impossible to determine propagation delay. Thus, the system needs to be removed and sent back to the manufacturer for testing purposes. Furthermore, since these methods require dedicated pins on the chips, they are not adapted to chips that require more and more I/O, e.g. switch fabric.

SUMMARY OF THE INVENTION

Thus, it is a broad object of the invention to remedy the short-comings of the prior art as described here above.

It is another object of the invention to provide a method and systems to measure propagation delay within a chip without requiring measure apparatus.

It is still another object of the invention to provide a method and systems to measure propagation delay within a chip without requiring dedicated pins or specific electrical contacts.

It is a further object of the invention to provide a method and systems to measure propagation delay within a chip without removing the board embedding the chip from the electronic system in which it is plugged.

The accomplishment of these and other related objects is achieved by a method to measure the propagation delay of a chip, using a micro-processor, said chip comprising means for evaluating the propagation delay and memorization means, said method comprising the steps of:

transmitting a request from said microprocessor to said chip for evaluating propagation delay;

evaluating the propagation delay in said means for evaluating the propagation delay of said chip;

memorizing the evaluated propagation delay in said memorization means of said chip;

transmitting a request from said microprocessor to said chip for reading said evaluated propagation delay in said memorization means of said chip; and, transmitting said evaluated propagation delay from said memorization means of said chip to said microprocessor, and by a system to measure the propagation delay within a chip comprising:

a logic path;

counter means adapted to count pulses of a system clock according to the state of a signal generated in said logic path;

memorization means adapted to store the number of said pulses counted in said counter means; and, a microprocessor interface, wherein said number of said pulses counted in said counter means stored in said memorization means, characterizing said propagation delay, can be accessed with a microprocessor.

Further advantages of the present invention will become apparent to the ones skilled in the art upon examination of the drawings and detailed description. It is intended that any additional advantages be incorporated herein.

BRIEF DESCRIPTION OF THE DRAWINGS

FIGS. 2a and 2b, depicts a second standard logic path used for determining propagation delay of a chip and associated timing analysis.

DETAILED DESCRIPTION OF THE PREFERRED EMBODIMENT

Since most of electronic systems use a microprocessor, the basic principle of the invention consists in using the microprocessor capabilities to measure the propagation delay of a chip comprising a standard microprocessor interface, embedded in such an electronic system. Thus, according to the invention, the microprocessor transmits an instruction to the semiconductor chip that evaluates the propagation delay and memorizes it in a dedicated memory register then, the microprocessor reads the estimated propagation delay in the corresponding memory register of the chip.

Figure 4:
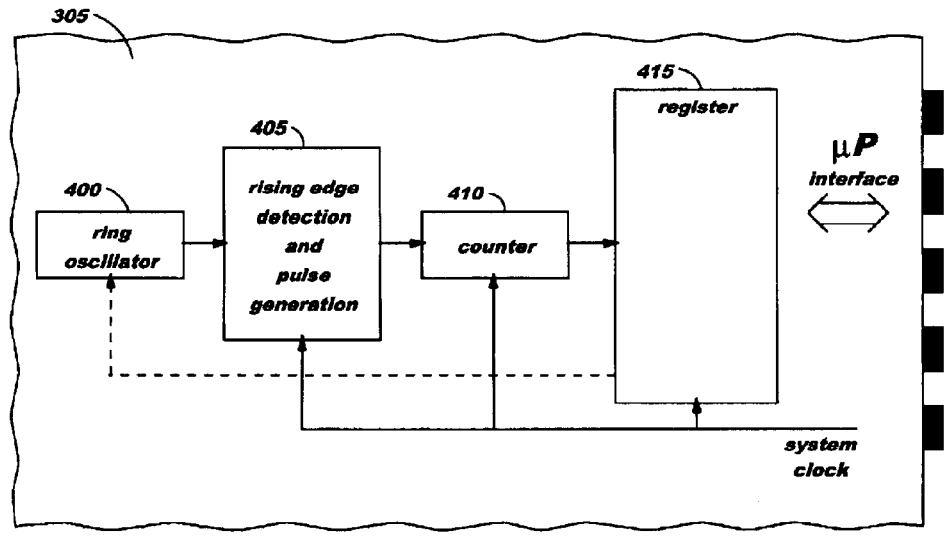
FIG. 4 illustrates the scheme of a first embodiment of the system used to determine the propagation delay of a chip according to the invention.

FIG. 4 illustrates the scheme of a first embodiment of the system used to determine the propagation delay of a chip according to the invention. Such system is implemented in a chip 305 having a microprocessor interface. The propagation delay measure circuit comprises a ring oscillator unit 400, a rising edge detection and pulse generation unit 405 and a counter unit 410. Chip 305 also comprises a memory register 415 wherein a value characterizing propagation delay is stored after estimation. The signal used to enable the propagation delay measure circuit is controlled by a microprocessor (not represented). Such signal may be connected directly to the microprocessor through a dedicated pin or may be generated in memory register 415 (the microprocessor writes an activation value in a specific location of the memory register) or in another circuit of the chip after a specific instruction received from the microprocessor through a standard interface has been decoded in the chip. Likewise, the microprocessor uses the standard interface (address and data busses) to read the value memorized in memory register 415.

When enabled, the ring oscillator unit 400 provides an output signal that frequency, being constant after an initialization phase, characterizes the propagation delay as mentioned above. The propagation delay is estimated by comparing frequencies of the ring oscillator unit 400 output and a system clock. Rising edge detection and pulse generation unit 405 provide pulses according to the output signal of ring oscillator unit 400 and the system clock. Counter unit 410 counts the number of system clock pulse between two pulses provided by rising edge detection and pulse generation unit 405. To improve propagation delay estimation, counter unit 410 may comprises two counters so as to count the number of system clock pulse during a predetermined number of pulse generated by rising edge detection and pulse generation unit 405. Thus, a first counter is used to count the number of system clock pulses and a second one counts the number of pulse generated by rising edge detection and pulse generation unit 405. The counted number of system clock pulses is stored in memory register 415.

Figure 1:
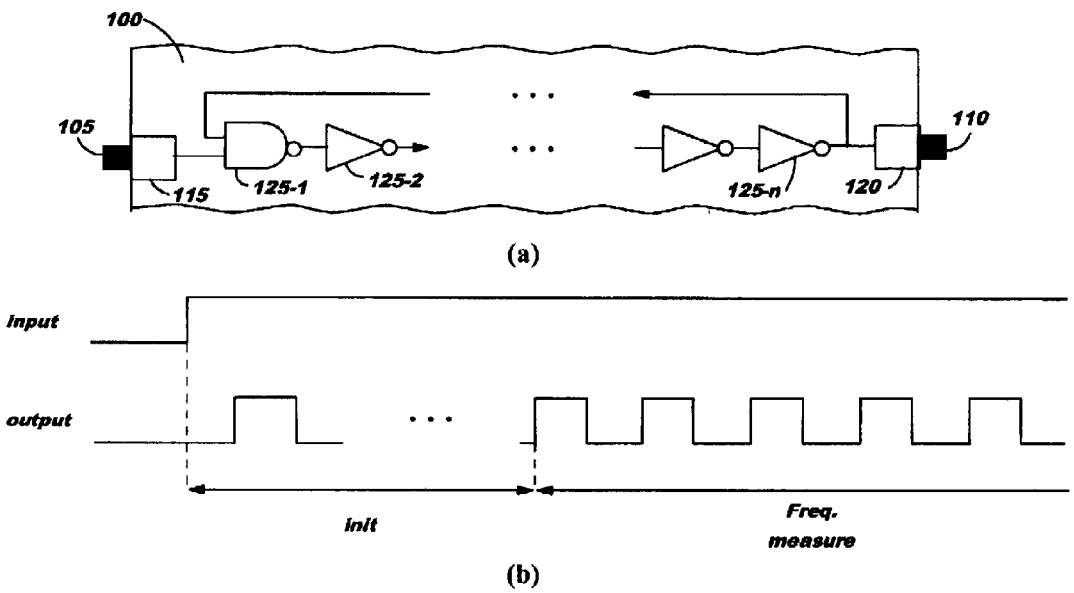
FIG. 1 comprising FIGS. 1a and 1b, describes a first standard logic path used for determining propagation delay of a chip and associated timing analysis.
Figure 2:
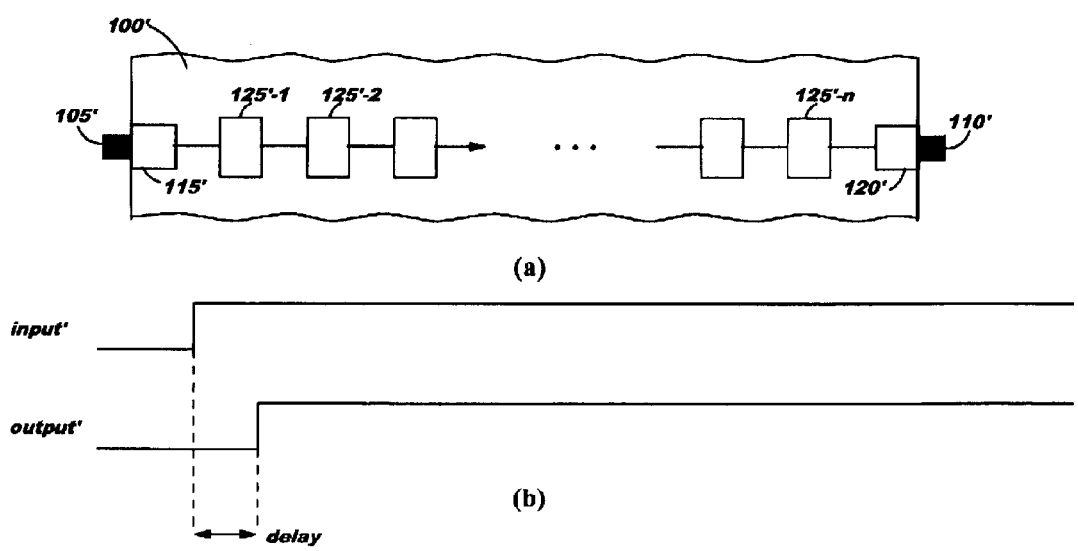
FIG. 2 comprising
Figure 3:
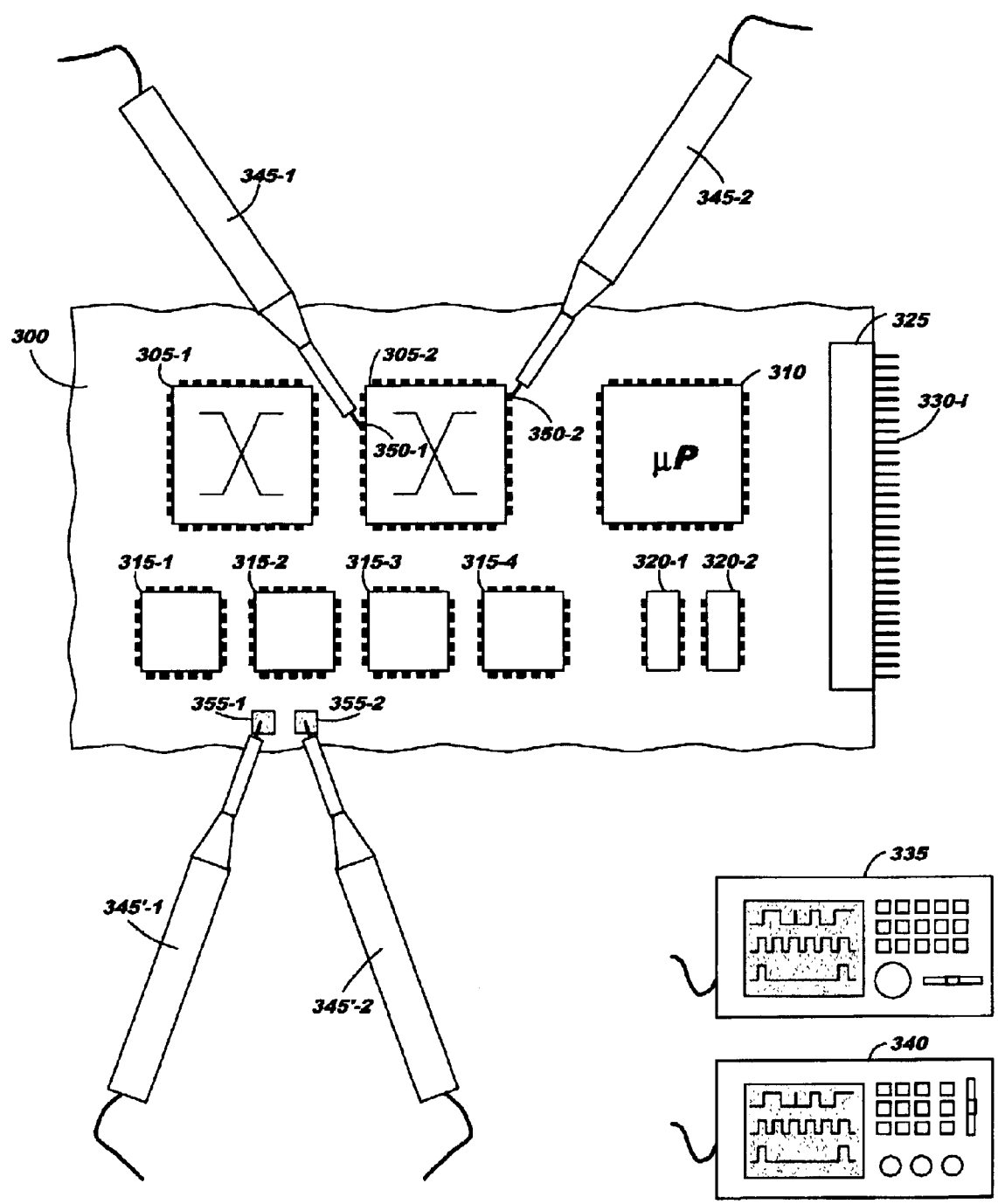
FIG. 3 illustrates the standard method used for determining the propagation delay of a chip.
Figure 5:
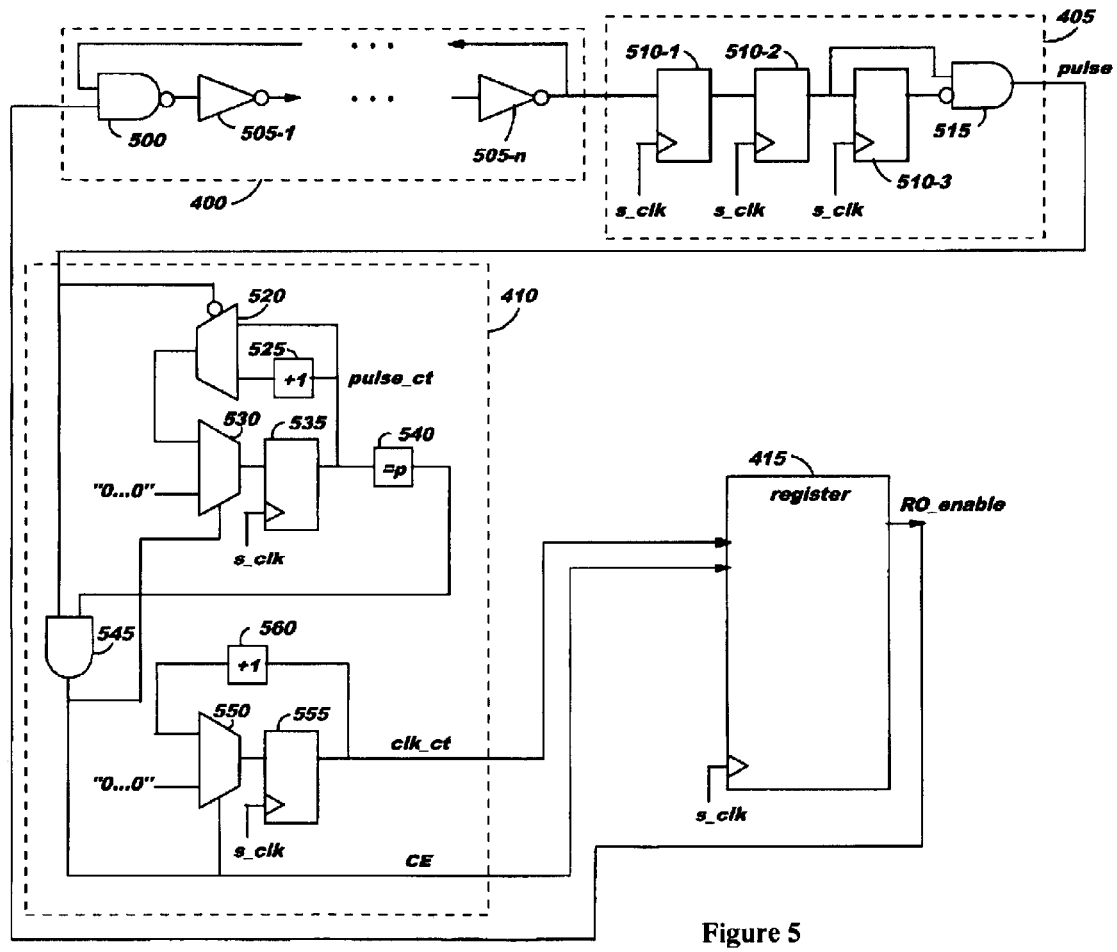
FIG. 5 shows a detailed view of an implementation example of the first embodiment.

Now turning to FIG. 5, it is shown a detailed view of an implementation example of the first embodiment as described above, i.e. ring oscillator unit 400, rising edge detection and pulse generation unit 405 and counter unit 410. In this example, ring oscillator unit 400 comprises a NAND gate 500 and several inverters 505-1 to 505-n. One input of NAND gate 500 correspond to the signal enabling ring oscillator unit 400, referred to as RO_enable, and its second input is connected to the output of ring oscillator unit 400. To initialize ring oscillator unit 400, the number of inverters must be an odd number thus, the number n of inverter logic elements must be an even number (the first element is a NAND gate). Ring oscillator unit 400 is similar to the ring oscillator comprising logic elements 125-1 to 125-n of FIG. 1a. The output of ring oscillator unit 400 corresponds to the input of rising edge detection and pulse generation unit 405. After a transition state of RO_enable signal, from 0 to 1 in this example, the ring oscillator unit 400 starts its initialization phase until its output frequency reaches a constant value, i.e. a constant frequency that depends both upon the logic elements of the ring oscillator unit 400 and its associated propagation delay.

Rising edge detection and pulse generation unit 405 comprises latches 510-1, 510-2, 510-3 and AND gate 515. The input of latch 510-1 is connected to the output of ring oscillator unit 400, the input of latch 510-2 is connected to the output of latch 510-1 and the input of latch 510-3 is connected to the output of latch 510-2. Latches 510-1, 510-2 and 510-3 are controlled by the system clock s_clk, as illustrated. One input of AND gate 515 is connected to the output of latch 510-3 that is inverted while its second input is connected to the output of latch 510-2. Thus, each time the output of ring oscillator unit 400 changes from state 0 to state 1 a pulse is generated on the output of AND gate 515. The output of AND gate 515, corresponding to the output of the rising edge detection and pulse generation unit 405, is referred to as signal pulse.

Counter unit 410, comprising two counters in this example, is connected to the output of the rising edge detection and pulse generation unit 405, i.e. signal pulse.

A first counter, comprising elements 520 to 540, counts the number of pulses generated by the rising edge detection and pulse generation unit 405. Multiplexor 520, controlled by signal pulse that is inverted, selects either the output of latch 535 or the output of latch 535 incremented by one in incrementer 525. The output of multiplexor 520 is linked to one input of multiplexor 530 that second input is set to "0 . . . 0" so as to reset this first counter when selected. The input of latch 535 is connected to the output of multiplexor 530. Latch 535 is controlled by the system clock s_clk. The output of latch 535, referred to as pulse_ct, is compared with a predetermined value p in comparator 540. The output of comparator 540 is connected to one input of AND gate 545 while the second input of AND gate 545 is connected to signal pulse. The output of AND gate 545, referred to as signal CE, controls multiplexor 530. Thus, the content of latch 535 is incremented by one each time the rising edge detection and pulse generation unit 405 generates a pulse and is reset to "0 . . . 0" if the value of latch 535 is equal to p.

A second counter, comprising elements 550, 555 and 560, counts the number of system clock pulses during a predetermined number of pulses generated by the rising edge detection and pulse generation unit 405. Multiplexor 550, controlled by signal CE, selects either value "0 . . . 0" or the output of latch 555 that value is incremented by one in incrementer 560. The input of latch 555, controlled by system clock s_clk, is connected to the output of multiplexor 550. The value of latch 555, referred to as clk_ct, is written in memory register 415 according to signal CE, i.e. when the first counter value has reached the predetermined value p of pulse generated by the rising edge detection and pulse generation unit 405.

Figure 6:
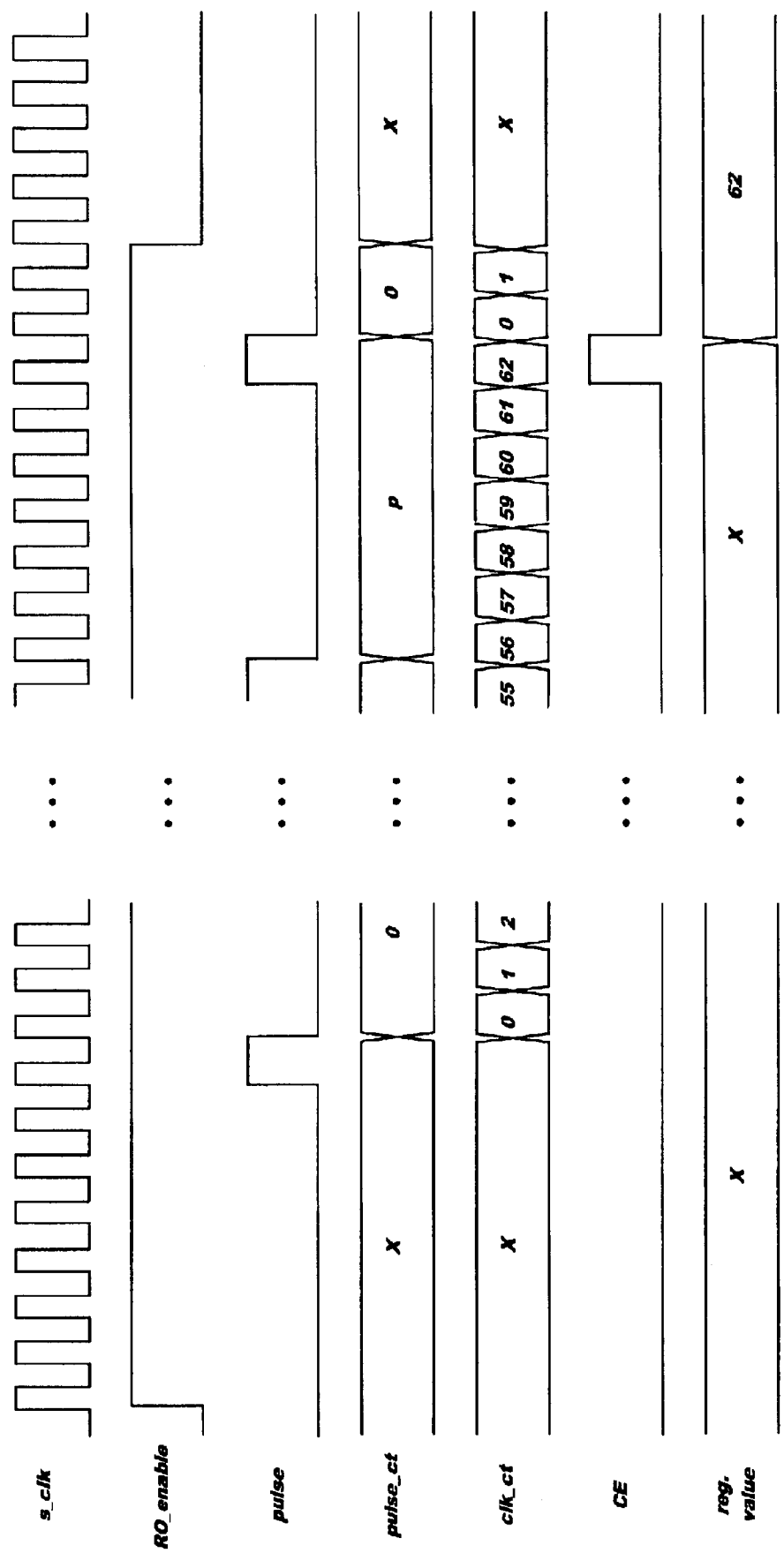
FIG. 6 depicts the timing analysis of the implementation example of the first embodiment.

FIG. 6 illustrates the behavior of the main signals described by reference to FIG. 5, i.e. signals s_clk, RO_enable, pulse, pulse_ct, clk_ct, CE and the memory register value. When the value of signal RO_enable is set to one, the ring oscillator is turned on and pulse are generated on signal pulse. Signal pulse_ct value represents the number of pulse detected on signal pulse. When signal pulse_ct value reaches the predetermined value p, signal pulse_ct value is reset to 0. Likewise, signal clk_ct value represents the number of system clock pulses detected from first pulse of signal pulse. Signal clk_ct is reset when signal pulse_ct value reaches the predetermined value p. When signal pulse_ct value reaches the predetermined value p, a pulse is generated on signal CE and the value of signal clk_ct is memorized in memory register 415.

Since the values of signal clk_ct and pulse_ct are not reset during initialization phase, the first value written in memory register 415 can not be used to determine propagation delay, it is required to use one of the next values of signal clk_ct, i.e. after signals clk_ct and pulse_ct have been reset, when a pulse is generated on signal CE. However, the response time of the system comprising units 400, 405 and 410 is generally very short compared with the time required for the microprocessor to read the value written in memory register 415 after signal RO_enable has been set to one and thus, the value read in memory register 415 is not the first written value. Nevertheless, the circuit implementation presented on FIG. 5 may be modified so as to reset signals clk_ct and pulse_ct during the initialization phase, i.e. when signal RO_enable is set to one.

The value NC written in memory register 415 characterizes the propagation delay of the ring oscillator unit 400. It represents the time, i.e. the number of system clock pulses, corresponding to p periods of the ring oscillator (400)

output. The corresponding propagation delay may be computed according to equation 2.

Figure 7:
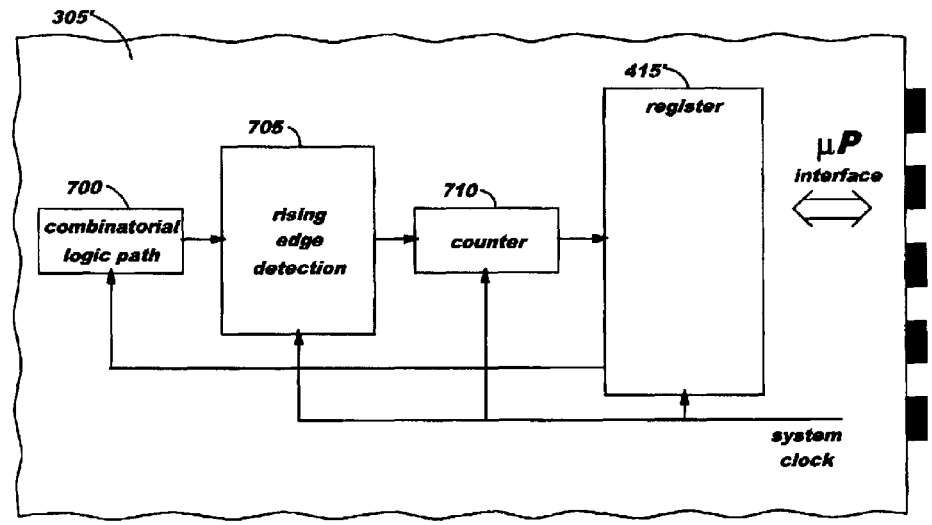
FIG. 7 illustrates the scheme of a second embodiment of the system used to determine the propagation delay of a chip according to the invention.
Figure 8:
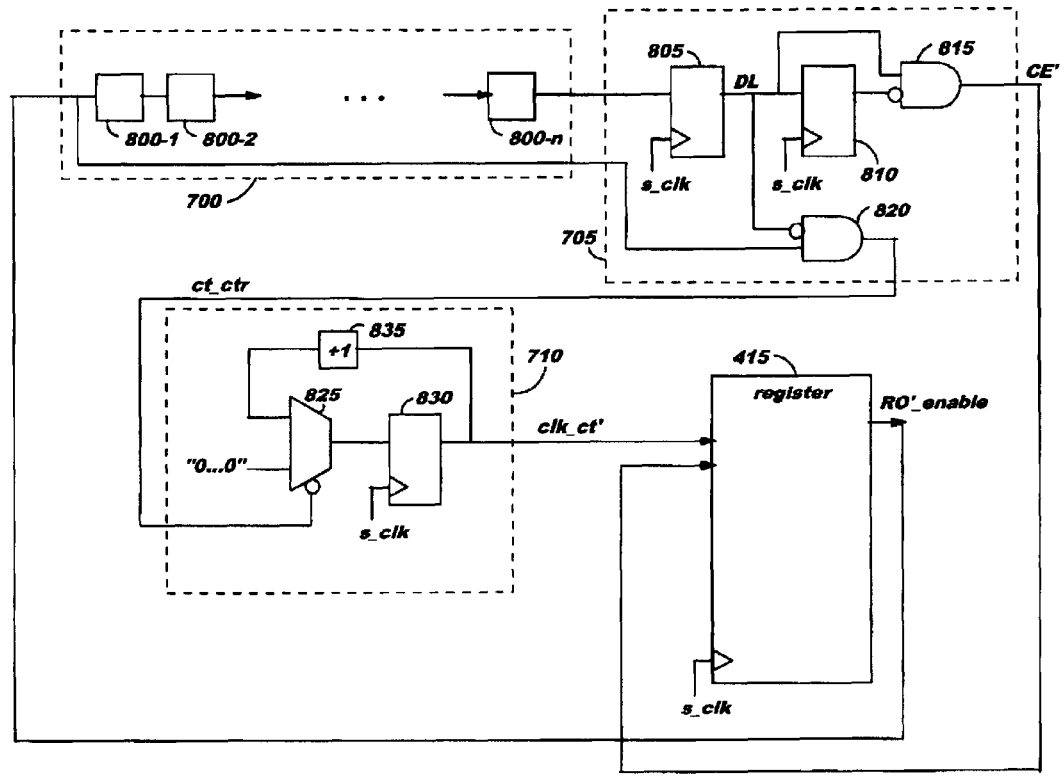
FIG. 8 shows a detailed view of an implementation example of the second embodiment.
Figure 9:
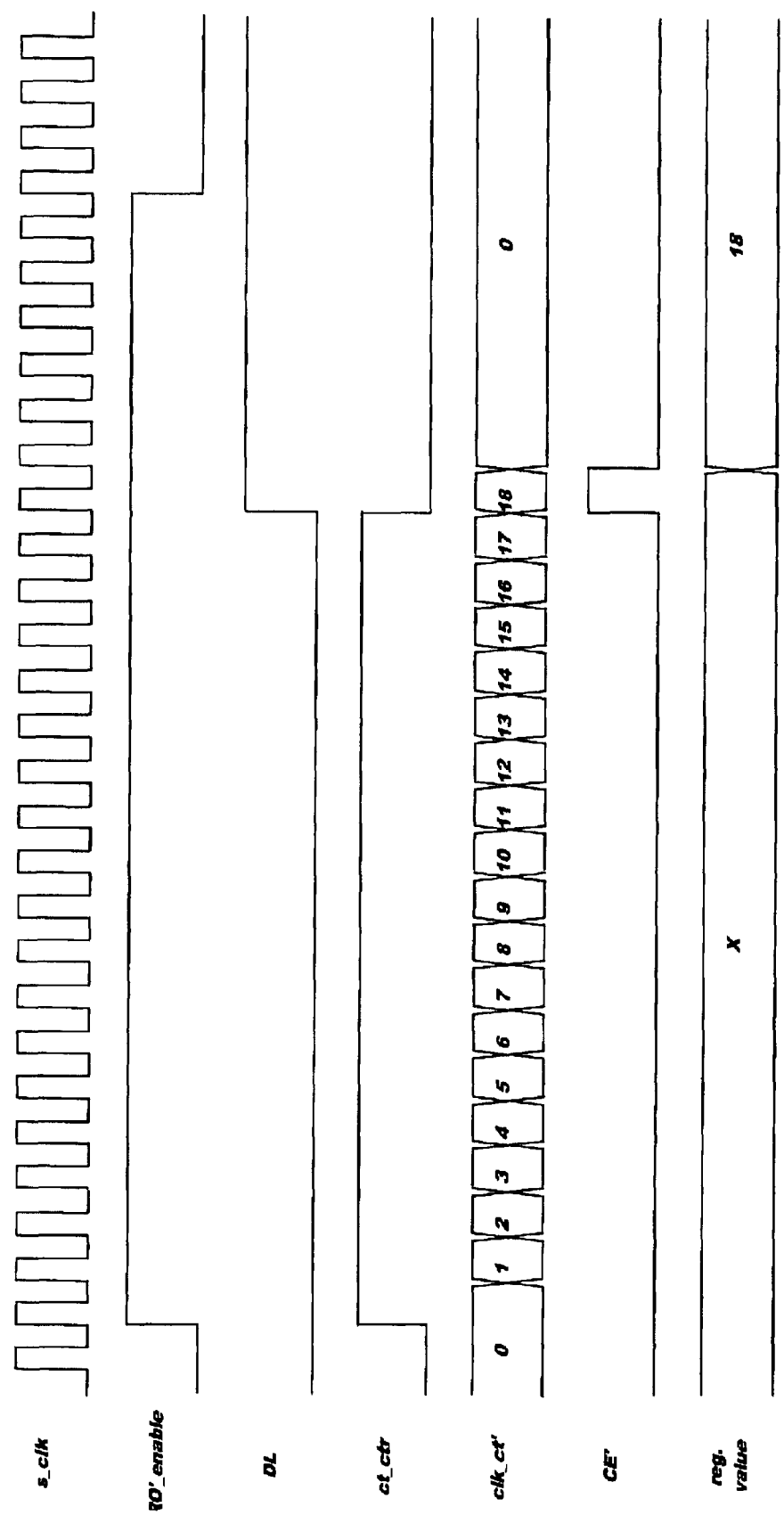
FIG. 9 depicts the timing analysis of the implementation example of the second embodiment.

FIGS. 7, 8 and 9 illustrate a second embodiment of circuit implementation. The system for determining the propagation delay according to the invention is implemented in a chip 305' having a microprocessor interface. In this embodiment, the propagation delay measure circuit comprises a combinatorial logic path unit 700, a rising edge detection unit 705 and a counter unit 710. Semiconductor chip 305' also comprises a memory register 415' wherein a value characterizing propagation delay is stored after it has been estimated. The signal used to enable the propagation delay measure circuit is controlled by a microprocessor (not represented). Such signal may be connected directly to the microprocessor through a dedicated pin or may be generated in memory register 415' (the microprocessor writes an activation value in a specific location of the memory register) or in another circuit of the chip after a specific instruction received from the microprocessor through a standard interface has been decoded in the chip. Likewise, the microprocessor uses the standard interface (address and data busses) to read the value memorized in memory register 415'.

The combinatorial logic path unit 700 comprises simple logic elements so that the output signal is similar (it may be inverted) to the input signal except that input and output signals are out of phase. The difference in phase corresponds to the propagation delay. Thus, to determine the propagation delay, input and output signals of combinatorial logic path unit 700 are compared in rising edge detection unit 705. Counter unit 710 is used to determine the difference in phase, i.e. to count the number of system clock pulses between input and output of signals in combinatorial logic path unit 700.

Now turning to FIG. 8, it is shown a detailed view of an implementation example of the second embodiment as described above, i.e. combinatorial logic path unit 700, rising edge detection unit 705 and counter unit 710.

A mentioned above, combinatorial logic path unit 700 comprises simple logic elements 800-1 to 800-n, e.g. inverters, that are serially connected. The number n of these simple logic elements must be enough to produce a propagation delay that could be measured efficiently. It is to be noticed that due to the specific rising edge detection circuit used in this example, the combinatorial logic path must not be an inverting logic path thus, the number n of inverters must be an even number. The input signal of combinatorial logic path unit 700 is referred to as RO'_enable.

Rising edge detection unit 705 comprises two latches 805 and 810 as well as two AND gates 815 and 820. The input of latch 805, controlled by system clock s_clk, is connected to the output of combinatorial logic path unit 700 and its output is referred to as signal DL. The input of latch 810, also controlled by system clock s_clk, is connected to the output of latch 805, i.e. signal DL. One input of AND gate 815 is connected to the output of latch 805, i.e. signal DL and its second input is connected to the output of latch 810 that is inverted. The output of AND gate 815 is referred to as signal CE'. One input of AND gate 820 is connected to the input of combinatorial logic path unit 700, i.e. signal RO' enable and its second input is connected to the output of latch 805, i.e. signal DL, that is inverted. The output of AND gate 820 is referred to as signal ct_ctr. Thus, rising edge detection unit 705 compares the input and output signals of combinatorial logic path unit 700 so as to provide two signals. A first signal ct_ctr, normally set to a first value, i.e.

0 in this example, is set to a second value, i.e. 1 in this example, when a signal is inputted in combinatorial logic path unit 700 until this signal is outputted from combinatorial logic path unit 700. A pulse is generated on a second signal CE' each time a signal inputted in combinatorial logic path unit 700 is outputted from combinatorial logic path unit 700.

Counter unit 710 comprises multiplexor 825, latch 830 and incrementer 835. One input of multiplexor 825 is set to value "0 . . . 0" and its second input is connected to the output of incrementer 835 so that the output of multiplexor 825 is set either to "0 . . . 0" or to the value of latch 830 that is incremented by one in incrementer 835. Multiplexor 825 is controlled by signal ct_ctr that is inverted. The input of latch 830, controlled by system clock s_clk, is connected to the output of multiplexor 825, its output is referred to as clk_ct'. Thus, counter unit 710 counts the number of system clock pulses generated when signal ct_ctr is set to the second value, i.e. 1 in this example. The counter value, i.e. the value of signal clk-ct', is written in memory register 415' when a pulse is generated in signal CE'.

The value NC written in memory register 415' characterizes the propagation delay along combinatorial logic path unit 700. It represents the time, i.e. the number of system clock pulses, required for a signal to be transmitted from the input of combinatorial logic path unit 700 to its output. The corresponding propagation delay may be computed according to equation 1.

FIG. 9 illustrates the behavior of the main signals described by reference to FIG. 8, i.e. signals s_clk, RO'_enable, DL, ct_ctr, clk_ct', CE' and the memory register value. When the value of signal RO'_enable is set to one, the transition state is transmitted along combinatorial logic path elements 800-1 to 800-n. The output of combinatorial logic path unit 700 is latched to create signal DL that is inverted and compared with signal RO'_enable. Thus, signal ct_ctr is set to one during the time required to transmit a transition state from the input of combinatorial logic path unit 700 to its output. Counter unit 710 counts the pulses of system clock s_clk when signal ct_ctr is equal to one. The content of counter unit 710 is reset and a pulse is generated on signal CE' when signal ct_ctr is set to zero. When a pulse is generated on signal CE', the value of counter unit 710 is written in memory register 415'.

While the invention has been described in term of preferred embodiments, those skilled in the art will recognize that the invention can be implemented differently. Likewise, in order to satisfy local and specific requirements, a person skilled in the art may apply to the solution described above many modifications and alterations all of which, however, are included within the scope of protection of the invention as defined by the following claims.

What is claimed is:

1. A method for measuring the propagation delay of a chip using a microprocessor, said method comprising the steps of:

1) transmitting a request from said microprocessor to said chip for evaluating propagation delay, said chip having a means for evaluating the propagation delay and a storage means;
  2) evaluating the propagation delay using said chip propagation delay evaluating means;
  3) storing the evaluated propagation delay in said storage means of said chip;
  4) transmitting a request from said microprocessor to said chip for reading said evaluated propagation delay in said storage means of said chip; and, 5) transmitting said evaluated propagation delay from said storage means of said chip to said microprocessor.

2. The method of claim 1 wherein said step of evaluating the propagation delay comprises the steps of:
   1) generating a signal having a frequency that is a function of the propagation delay, said signal traveling a predetermined path, the path having at least one input, each input having at least one corresponding output; and,
   2) counting the number of pulses a system clock from the input of the signal to one of the corresponding outputs of the signal, wherein said counted number of system clock pulses characterizes the propagation delay.

3. The method of claim 1 wherein said step of evaluating the propagation delay comprises the steps of:
   1) generating a signal having an initial signal state, at least one signal transition state and a frequency which is a function of said propagation delay;
   2) determining a time period, said time period equaling (the time of count of a predetermined number of transitional states–the time at initial signal state); and,
   3) counting the number of pulses generated by a system clock during said time period, wherein said counted number of pulses of said system clock characterizes the propagation delay.

4. The method of claim 2 wherein said step of counting the number of pulses generated by a system clock comprises the steps of:
   1) inputting a first transition signal state at an input of a logic path;
   2) counting the number of pulses of a system clock pulse counter, the counting commencing with the inputting of the first transition signal state;
   3) detecting the state of the first transition signal at the output of the logic path; and,
   4) stopping the counting of said pulses of said system clock pulse counter when the first signal transition state is detected at the output, wherein said counted number of pulses of said system clock characterizes the propagation delay.

5. A system to measure the propagation delay within a chip comprising:
   1) a logic path, said logic path having at least one first inputted signal, said logic path generating at least one multiple state signal, said generated signal having at least one outputted signal state;
   2) a counter means adapted to count the pulses of a system clock corresponding to the interval between a first predetermined input and at least one corresponding generated output;
   3) a microprocessor interface;
   4) a storage means adapted to store the count of said pulses, said storage means in communication with the microprocessor interface, wherein said number of said pulses counted characterizes the propagation delay.

6. The system of claim 5 wherein the first predetermined input is the first inputted signal and the at least one corresponding output is the at least one generated signal.

7. The system of claim 5 wherein the logic path further comprises at least one transitional signal state, said at least one transitional signal state generated by the logic path prior to the at least one corresponding output.

8. The system of claim 6 wherein said counter means further comprises:
   1) a first counter means to count the number of signal transition states of said signal from a first signal transition state to at least a second signal transition state, said first counter means generating a control signal when the first counter means count reaches a predetermined value;
   2) a second counter means to count pulses of a system clock from said first signal transition state until said control signal is generated.

9. The system of claim 5 wherein said logic path comprises a ring oscillator.

10. The system of claim 6 wherein said logic path comprises a ring oscillator.

11. The system of claim 7 wherein said logic path comprises a ring oscillator.

12. The system of claim 5 further comprising a signal detection means to compare said first predetermined input and the generated output.

13. The system of claim 7 wherein the first predetermined input is one of the at least one transitional signals and the generated output is the outputting of said generated signal.

14. The system of claim 5 wherein the logic path further comprises one transitional signal state, said transitional signal state equal to the at least one corresponding output signal.

15. The system of claim 14 wherein said logic path comprises a ring oscillator.

* * * * *